United States Patent
Kumar et al.

(10) Patent No.: US 6,905,616 B2
(45) Date of Patent: *Jun. 14, 2005

(54) METHOD OF RELEASING DEVICES FROM A SUBSTRATE

(75) Inventors: Ajay Kumar, Sunnyvale, CA (US); Anisul H Khan, Santa Clara, CA (US); Sanjay M Thekdi, Santa Clara, CA (US); Sharma V Pamarthy, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 119 days.

This patent is subject to a terminal disclaimer.

(21) Appl. No.: 10/382,562

(22) Filed: Mar. 5, 2003

(65) Prior Publication Data

US 2004/0173575 A1 Sep. 9, 2004

(51) Int. Cl.$^7$ ................................ H01L 21/00
(52) U.S. Cl. ................ 216/2; 216/11; 216/79; 438/719; 438/733; 438/739
(58) Field of Search ................ 216/2, 11, 79; 438/719, 733, 739

(56) References Cited

U.S. PATENT DOCUMENTS

| | | | |
|---|---|---|---|
| 5,683,591 A | * | 11/1997 | Offenberg ................ 216/2 |
| 6,238,580 B1 | * | 5/2001 | Cole et al. ................ 216/2 |
| 6,304,367 B1 | | 10/2001 | Battilana et al. |
| 6,334,761 B1 | | 1/2002 | Tai et al. |
| 6,428,713 B1 | | 8/2002 | Christenson et al. |
| 6,458,615 B1 | | 10/2002 | Fedder et al. |
| 6,522,457 B2 | | 2/2003 | Battilana |
| 6,551,849 B1 | | 4/2003 | Kenney |
| 6,596,988 B2 | | 7/2003 | Corso et al. |
| 6,627,882 B2 | | 9/2003 | Schultz et al. |
| 6,633,031 B1 | | 10/2003 | Schultz et al. |
| 2003/0071015 A1 | | 4/2003 | Chinn et al. |
| 2003/0124848 A1 | | 7/2003 | Chinn et al. |
| 2004/0077178 A1 | * | 4/2004 | Yang et al. ................ 438/710 |

OTHER PUBLICATIONS

Merry et al., "Method for plasma etching a Dielectric Layer," U.S. Appl. No. 10/655,231, filed Sep. 3, 2003.

Chinn, et al., "Disposable Barrier Technique for Through Wafer Etching in MEMS," U.S. Appl. No. 10/274,403, filed Oct. 18, 2002.

* cited by examiner

*Primary Examiner*—Shamim Ahmed
(74) *Attorney, Agent, or Firm*—Moser, Patterson & Sheridan LLP; Joseph Bach

(57) ABSTRACT

Micro devices are formed in situ in a high density in a substrate comprising a masked silicon layer over a stop layer of a silicon compound, by anisotropically etching the desired feature in the silicon layer, overetching to form a notch at the silicon-stop layer interface, depositing a protective fluorocarbon polymer layer on the sidewalls and bottom of the etched silicon layer, and isotropically etching to separate the etched feature from the stop layer. This method avoids the problems of stiction common in other methods of forming micro devices.

9 Claims, 2 Drawing Sheets

METHOD OF RELEASING DEVICES FROM A SUBSTRATE

This invention relates to a method of releasing microdevices from a substrate. More particularly, this invention relates to a method of releasing microdevices that avoids stiction.

BACKGROUND OF THE INVENTION

Microelectromechanical systems (hereinafter MEMS) have been developed for movable micro devices, such as hygroscopes, accelerometers, tunable RF capacitors, digital mirrors, sensors and the like. They are used for forming small electrical and mechanical structures on a substrate, particularly a substrate of silicon or a silicon-containing material. These devices are made using conventional semiconductor processing techniques, such as chemical vapor deposition and plasma etching for example.

FIG. 1 illustrates a conventional three-layer substrate that can be used to make a MEMS device. A substrate layer of silicon 10 is covered with a sacrificial layer of silicon oxide 11 and a layer of polysilicon 12 deposited thereover. In accordance with a prior art method, the silicon oxide layer 11 is etched away to at least partially separate the layer of polysilicon 12 from the substrate 10. This etch step is known as release. FIG. 2 illustrates a partial etch of the sacrificial silicon oxide layer 11, as by using an isotropic wet HF etch. Now the polysilicon feature 12 can move, e.g., bend toward and away from the silicon substrate 10. Suitable etchants are anhydrous and aqueous hydrogen fluoride (HF).

The above method however requires the steps of deposition and removal of the sacrificial layer, and requires a wet etch, as of HF, to etch through the sacrificial silicon oxide layer.

In addition to the extra steps required for depositing and isotropically etching away the sacrificial layer, release is also a problem. Release is a complex process wherein the silicon oxide layer must be controllably etched. If too much silicon oxide is removed, the desired structure is undercut; if too little silicon oxide is etched away, frozen microstructures are formed that are not able to move as intended. Further, such an etch produces residues which adhere to the substrate.

Another part of the problem is that different silicon oxides have different etch rates. Doped oxides, such as PSG, BPSG and doped TEOS oxide, attain a high and fairly stable etch rate quite rapidly. However, dense oxides, such as thermal oxides, TEOS oxides and high temperature oxides, have an etch initiation period, and a much slower etch rate, even after initiation. Etch rates can also vary with device design. Thus it is difficult to know how long the etch needs to be carried out for the desired release.

Aqueous HF has traditionally been used to isotropically etch silicon oxides. However, this etchant has a high surface tension that causes capillary and van der Waals forces that pull the released features toward the substrate until they contact each other. This results in a generally permanent adhesion of the feature to the substrate, a result known as stiction.

Anhydrous HF has also been tried as a release etchant. However, it is a very strong acid, and will damage materials used in the interior of the etch chamber, adding to the costs of the process. A special chamber must be made, one that is at least partially impervious to anhydrous HF, a difficult and expensive challenge.

Thus a method of releasing MEMS devices that does not cause stiction, and that can be done in situ in a single chamber with fewer steps and high throughput that results in reduced costs, would be highly desirable.

SUMMARY OF THE INVENTION

According to the present multi-step method, MEMS devices are formed in silicon and released from an underlying substrate, generally a silicon compound, as of silicon oxide. A first anisotropic etch through a patterned mask layer is carried out to etch straight walled features through the silicon layer down to the substrate or stop layer. An overetch step is then carried out that creates a notch at the interface between the etched layer and the stop layer.

A conformal deposit of a fluorine-containing polymer is then deposited on the sidewalls and on the bottom of the etched feature, using a fluorine-containing gas. This polytetrafluoroethylene-type polymeric deposit protects the sidewalls and the underlying stop layer from further erosion.

An isotropic etch is then carried out at the unprotected notch area until the etched feature is separated or released from the stop layer. This method avoids stiction.

DETAILED DESCRIPTION OF THE INVENTION

Figure 1:
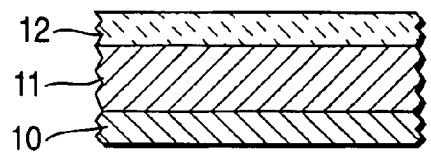
FIG. 1 is a prior art trilayer for making MEMS devices in a conventional way.
Figure 2:
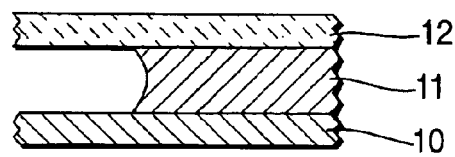
FIG. 2 is a prior art trilayer after an isotropic etch.

The steps of the present invention will be described with reference to the Drawing.

Figure 3:
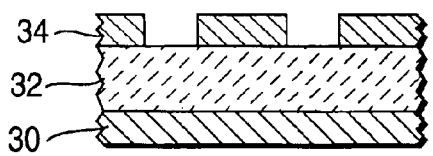
FIG. 3 illustrates a trilayer for making MEMS devices in accordance with the present invention.

As shown in FIG. 3, a silicon layer 32 has a patterned mask layer 34 thereover, and a stop layer 30 thereunder, which stop layer can be a silicon oxide or silicon nitride layer for example.

Figure 4:
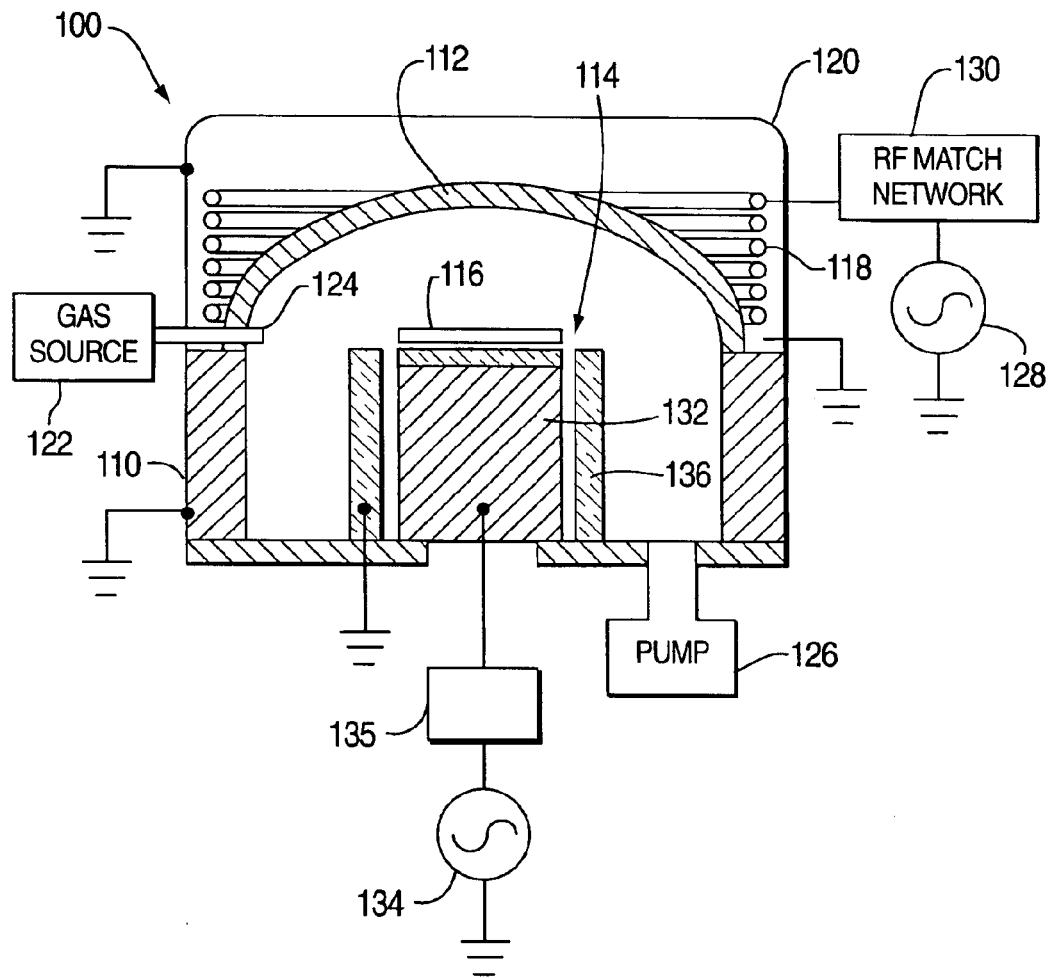
FIG. 4 is a cross sectional view of a plasma etch chamber that can be used to carry out all of the steps of the present method in situ.

An anisotropic etch is then carried out in a high density plasma reactor as shown in FIG. 4, which will be described below.

Referring to FIG. 4, a reactor chamber 100 having a grounded conductive cylindrical sidewall 110 and a shaped dielectric ceiling 112, e.g., dome shaped. The reactor 100 includes a substrate support electrode 114 for supporting a substrate 116 to be processed in the chamber 100; a cylindrical inductor coil 118 surrounding an upper portion of the chamber beginning near the plane of the top of the substrate 116 or the substrate support electrode 114, and extending upwardly therefrom toward the top of the chamber 100; a process gas source 122 and a gas inlet 124, which can be a plurality of inlets spaced about the interior of the chamber 100; and a pump 126 for controlling the chamber pressure.

The coil inductor 118 is energized by a plasma source power supply, or RF generator 128, through a conventional active RF match network 130, the top winding of the inductor coil 118 being "hot" and the bottom winding being grounded. The substrate support electrode 114 includes an interior conductive portion 132 connected to a bias RF power supply or generator 134 via a match network 135, and an exterior conductor 136 which is insulated from the interior conductive portion 132. A conductive grounded RF shield 120 surrounds the coil inductor 118.

Figure 5:
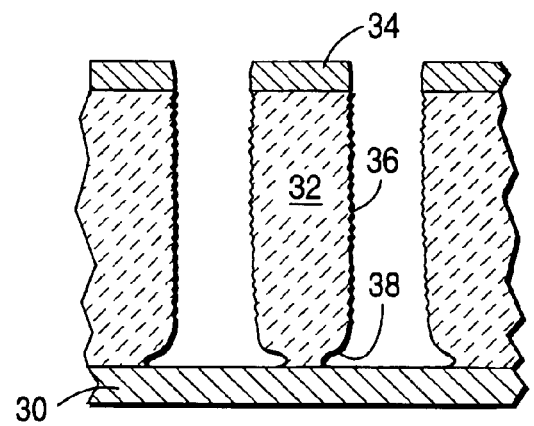
FIG. 5 illustrates anisotropically etched features that have been etched through a patterned mask and overetched to create a notch at the interface between the etched layer and the stop layer.

To carry out the present process, the source power is turned on and one or more processing gases are passed into the chamber 100 from appropriate gas containers (not shown). Initially an anisotropic etch is carried out through the patterned mask layer, using $SF_6$ or other fluorine-containing etch gas, in combination with a passivation gas such as oxygen and HBr. An overetch step is carried out next until a notch is created at the interface of the etched silicon layer 32 and the stop layer 30. This step is carried out in the absence of bias power, which can reduce the notch. The resultant polysilicon features 36 having a notch 38 at the interface with the stop or substrate layer 30, is shown in FIG. 5.

Figure 6:
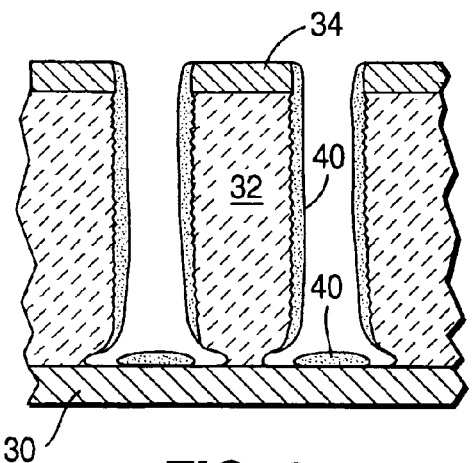
FIG. 6 illustrates the features of FIG. 5 after a fluorine-containing polymer has been deposited on the sidewalls and bottom of the etched features.

The gases in the chamber are then changed to deposit a fluorine-containing polymer 40 onto the sidewalls and the bottom of the etched features, as shown in FIG. 6. This fluorine-containing polymer 40 also deposits on the sidewalls of the patterned mask layer 34 to protect them from further erosion.

During this deposition step, the power to the chamber 100 from the inductive RF power source 128 is suitably about 200 up to about 3000 Watts, and is preferably from about 500 to about 2000 Watts. The RF source can be a 12.56 MHz power source. No bias power is used during the polymer deposition step. The pressure in the chamber during this step is maintained at about 5 to 300 millitorr.

Suitable fluorocarbon deposition gases include CxFyHz, wherein x an integer from 1 to 5, y is an integer from 1 to 12 and z is an integer from 0–12. Such gases include $CH_2F_2$, $C_4F_6$, $C_4F_8$ and the like. HBr together with a fluorohydrocarbon such as $CHF_3$ or a combination of $CHF_3$ and $SiF_4$ can also be used. Another combination that deposits a fluorine-containing polymer is a mixture of $SiF_4$ and oxygen. Such gases deposit polytetrafluoroethylene-like coatings on the sidewalls of the etched features to protect them during the following etch step.

Suitably the deposition step is carried out at a chamber pressure of about 18 millitorr pressure using about 700 Watts of power and a gas flow of about 140 sccm for about 5 seconds.

Figure 7:
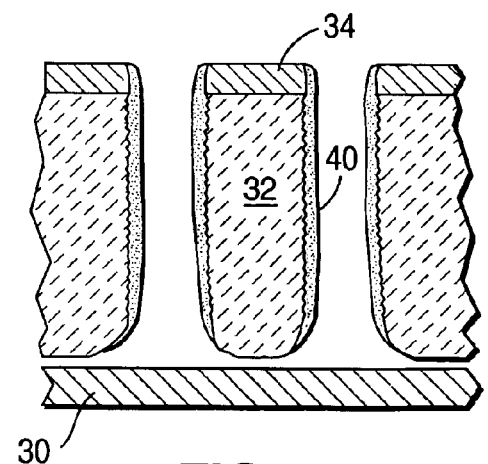
FIG. 7 illustrates the features of FIG. 6 after separation via an isotropic etch of the etched device features from the stop layer.

Without changing the reaction conditions of pressure and power in the chamber, an isotropic etch is then carried out to etch away the notched area and separate the etched features from the substrate, as shown in FIG. 7. An isotropic etch of silicon can be carried out with $SF_6$, oxygen and a fluorocarbon, or the gases can be switched between $SF_6$ and a fluorocarbon.

Thus the etched features or devices are now separated from the substrate without requiring a wet etch, and without the formation of stiction.

Thus the desired microfeatures can be formed in silicon with a first step anisotropic etch, and an overetch which forms a notch at the interface between the polysilicon layer and its underlying substrate layer; in a second step depositing a fluorine-containing polymer on the sidewalls and bottom of the etched features; in a third step, an isotropic etch is carried out to attack the notched area and separate the silicon feature from the stop layer. All these steps can be carried out in a single, conventional plasma chamber.

The present process thus avoids the need for a sacrificial layer, and of mixing dry and wet etch steps that cause stiction. Separation of the MEMS features from its substrate is thus rapid and complete.

The above steps can be carried out sequentially. Alternatively, to make more complex shapes, the initial mask layer can be removed after the first features are formed, a photoresist layer re-applied and a different pattern formed therein, and the etch and deposition steps repeated one or more times, in any order, to form differently shaped micro devices.

The invention will be further illustrated by the following Example, but the invention is not meant to be limited to the details described therein.

EXAMPLE

A first anisotropic etch of the patterned masked substrate of FIG. 3 was carried out in the reaction chamber of FIG. 4, using a pressure of about 18 millitorr, 700 Watts of source power and a $SF_6$ gas flow rate of 50 sccm to which 50 sccm of oxygen and 100 sccm of HBr were added. This main etch step was continued until the stop layer was reached.

An overetch step was next carried out at a pressure of 25 millitorr and 700 Watts of source power, passing 100 sccm of $SF_6$ and 60 sccm of $C_4F_8$ into the chamber for 12 seconds.

The resultant notch formation is shown in FIG. 5. A deep notch can readily be seen; when the etched features have a diameter of about 2–5 microns, the notch is over one-half of the line width of the features.

A fluorocarbon polymer is next deposited on the sidewalls and the bottom of the etched features. Using $C_4F_8$ at the same reaction conditions in the chamber, i.e., 18 millitorr pressure and 700 watts of source power, a gas flow of 140 sccm was passed into the chamber for five seconds. A protective polymer coating was formed as shown in FIG. 6.

The etched features were then separated from the substrate with an isotropic etch using $SF_6$ or $XnF_2$, as shown in FIG. 7.

Thus the desired features can be formed with an anisotropic etch, a notch can be formed at the silicon-stop layer interface using an overetch, a protective polymer coating applied, and a final isotropic etch carried out to controllably separate the etched features from the substrate, all in a single, conventional plasma chamber. The present process avoids the need for a sacrificial layer, and the mixing of dry and wet steps that causes stiction. Separation of the MEMS features from the substrate is thus rapid and complete.

Although the invention has been described in terms of specific embodiments, other plasma chambers and reaction conditions can be used, as will be known to those skilled in the art. The invention is only to be limited by the scope of the appended claims.

We claim:

1. A method of releasing devices formed in a silicon layer over a stop layer without stiction comprising:
    a) anisotropically etching features in a masked silicon layer down to the stop layer;
    b) overetching the features to form a notch at the silicon-stop layer interface;
    c) depositing a fluorine-containing polymer over the sidewalls and bottom of the etched features; and
    d) isotropically etching to widen the notch until the etched feature becomes separated from the stop layer.

2. A method according to claim 1 wherein steps a) through d) are carried out sequentially in situ in a plasma etch chamber.

3. A method according to claim 1 wherein step a) is carried out using $SF_6$ and a passivation gas at a chamber pressure of about 18 millitorr and about 700 watts of source power.

4. A method according to claim 1 wherein step b) is carried out using a mixture of $SF_6$ and a fluorocarbon gas at a chamber pressure of about 25 millitorr until a notch forms at the silicon-stop layer interface.

5. A method according to claim 1 wherein step c) is carried out using a fluorine-containing gas having the formula $C_xF_yH_z$ wherein x is an integer of 1 to 5; y is an integer of 1 to 12, and z is an integer of 0 to 12.

6. A method according to claim 1 wherein step d) is carried out using an etchant selected from the group consisting of $SF_6$ and $XnF_2$ until the silicon feature is separated from the stop layer.

7. A method according to claim 1 wherein steps a) through d) are carried out in sequence.

8. A method according to claim 1 wherein the mask layer is a photoresist mask layer.

9. A method according to claim 8 wherein steps a) to c) are carried out sequentially, the photoresist mask layer is removed, another photoresist layer deposited and patterned, steps a) to c) repeated one or more times to form a more complex pattern in the silicon layer, and carrying out step d).

* * * * *